United States Patent [19]
Pascucci

[11] Patent Number: 6,100,740
[45] Date of Patent: Aug. 8, 2000

[54] CIRCUIT FOR SELECTIVELY ENABLING ONE AMONG A PLURALITY OF CIRCUIT ALTERNATIVES OF AN INTEGRATED CIRCUIT

[75] Inventor: Luigi Pascucci, Sesto San Giovanni, Italy

[73] Assignee: STMicroelectronics S.r.l., Italy

[21] Appl. No.: 08/957,685

[22] Filed: Oct. 24, 1997

[30] Foreign Application Priority Data

Oct. 25, 1996 [IT] Italy .................................. MI96A2210

[51] Int. Cl.[7] .................................................. H03K 3/356
[52] U.S. Cl. .......................... 327/210; 327/208; 327/525
[58] Field of Search ................................... 327/199, 200, 327/208, 209, 210, 215, 219, 225, 407–413, 99, 525

[56] References Cited

U.S. PATENT DOCUMENTS

| | | | |
|---|---|---|---|
| 4,614,881 | 9/1986 | Yoshida et al. .......................... | 327/199 |
| 5,487,038 | 1/1996 | Komarek et al. ........................ | 365/191 |
| 5,608,877 | 3/1997 | Sung et al. .............................. | 395/284 |
| 5,659,498 | 8/1997 | Pascucci et al. ......................... | 365/154 |

OTHER PUBLICATIONS

IBM Technical Disclosure Bulletin, vol. 30, No. 12, May 1988.
IBM Technical Disclosure Bulletin, vol. 30, No. 2, Jul. 1987.

*Primary Examiner*—Kenneth B. Wells
*Attorney, Agent, or Firm*—Theodore E. Galanthay; E. Russell Tarleton; Seed Intellectual Property Law Group

[57] ABSTRACT

A circuit for selectively enabling one circuit from among a plurality of circuit alternatives of an integrated circuit includes a selection circuit for selecting one circuit from among the plurality of circuit alternatives. The selection circuit is controlled by a bistable circuit having a preferred state. A disactivatable forcing circuit associated with the bistable circuit is provided for forcing the bistable circuit into a state opposite than the preferred state, so that when the forcing circuit is disactivated, the bistable circuit automatically switches to the preferred state.

11 Claims, 2 Drawing Sheets

CIRCUIT FOR SELECTIVELY ENABLING ONE AMONG A PLURALITY OF CIRCUIT ALTERNATIVES OF AN INTEGRATED CIRCUIT

TECHNICAL FIELD

The present invention relates to a circuit for selectively enabling one circuit from among a plurality of circuit alternatives of an integrated circuit.

BACKGROUND OF THE INVENTION

When designing integrated circuits, it is often necessary to choose from among several circuit alternatives, frequently each circuit alternative having quite different characteristics.

Choosing one circuit solution over the others possible involves the exclusion of the other circuit alternatives. However, it may happen that the solution chosen during the design phase is not practically the best one. Additionally, after one circuit solution has been chosen, switching to another alternative solution initially discarded involves remaking all or at least some of the photolithographic masks used in the manufacturing process. This obviously causes an increase in the manufacturing costs. Moreover, whenever one or more photolithographic masks have to be redesigned, there is always the possibility of incurring new errors. This causes an increase in the testing phase.

Therefore, in practice the designer of an integrated circuit provides, whenever it is possible, for the implementation of more than one circuit alternative for at least some of the circuit blocks. The provision of such circuit alternatives, or "options," involves providing alternative metal interconnection lines that can be disabled during the testing of the device. For example, assuming that it is desired to provide more than one possibility for the control signal of a generic circuit block, it is possible to provide a multiplexer supplied with several signals, among which the one most suitable for driving the circuit block is to be determined. During the testing of the device, it is possible to deliberately interrupt some of the electrical interconnection lines in such a way that the multiplexer output switches among all the possible driving signals. Once the best circuit alternative has been determined, the photolithographic mask defining the metal interconnections, which is typically one of the last masks in the manufacturing process flow, will be redesigned so as to render the chosen alternative definitive.

However, configuring the multiplexer, or more generally configuring the combinatorial circuits that allow experimentation of more than one option, by interrupting the metal interconnection lines has the disadvantage of leaving the inputs of the logic circuits connected to the interrupted interconnection lines floating, and not at a well-defined logic level. This causes indetermination of the integrated circuit performance and increases the device's power consumption because of the absence of well-defined logic levels.

In order to configure the combinatorial circuits that choose from among the several circuit alternatives possible, it is also possible to use programmable nonvolatile memory elements. However, this approach normally complicates the manufacturing process because the process technology for the integration of the memory elements must be used.

Similarly, other testing solutions may be implemented. For example, using so-called "third-levels" of voltage applied to the input terminals of the integrated circuit. However, these solutions require the use of specially-designed circuits, which result in an increase in the design costs and in the device area.

SUMMARY OF THE INVENTION

According to the principles of the present invention, a circuit is provided for selectively enabling one circuit from among a plurality of circuit alternatives of an integrated circuit. The circuit provided does not involve overly complex circuit networks and does not require specific technological processes for its integration. The circuit allows for simple experimental testing of a plurality of alternative circuit solutions while overcoming the previously mentioned problems related to the absence of well-defined logic levels inside the integrated circuit, which may introduce anomalous current paths. It also does not require a complex redesign to implement the best circuit alternative once it has been determined.

According to the present invention, such object is attained by means of a circuit for selectively enabling one among a plurality of circuit alternatives of an integrated circuit, comprising selection circuit means for selecting one circuit from among the circuit alternatives. The selection means are controlled by a bistable circuit means having a preferred state. Disactivatable forcing means associated to the bistable means are provided for forcing the bistable means into a state opposite to the preferred state, so that when the forcing means are disactivated, the bistable circuit means automatically switches to the preferred state.

Thanks to the present invention, it is possible to test several alternative circuit solutions by simply integrating in the integrated circuit a small and simple network that can be realized in any technological process. The circuit of the present invention, comprising bistable means, does not introduce current consumption, particularly with regards to any current consumption caused by the uncertainty of the logic level of signals driving the logic gates. The circuit of the invention also does not require any complicated test procedures which are normally involved with the use of complex circuit networks.

These and other features and advantages of the present invention will be made apparent by the following detailed description of two particular embodiments thereof, illustrated as non-limiting examples in the annexed drawings.

DETAILED DESCRIPTION OF THE INVENTION

Figure 1C:
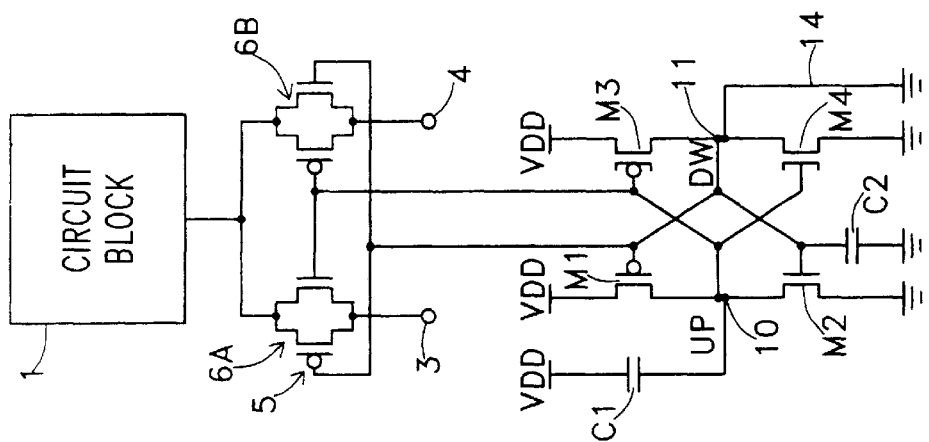
FIGS. 1A–1C show an embodiment of the circuit according to the present invention in a first operating condition, a second operating condition, and a final operating condition.
Figure 1B:
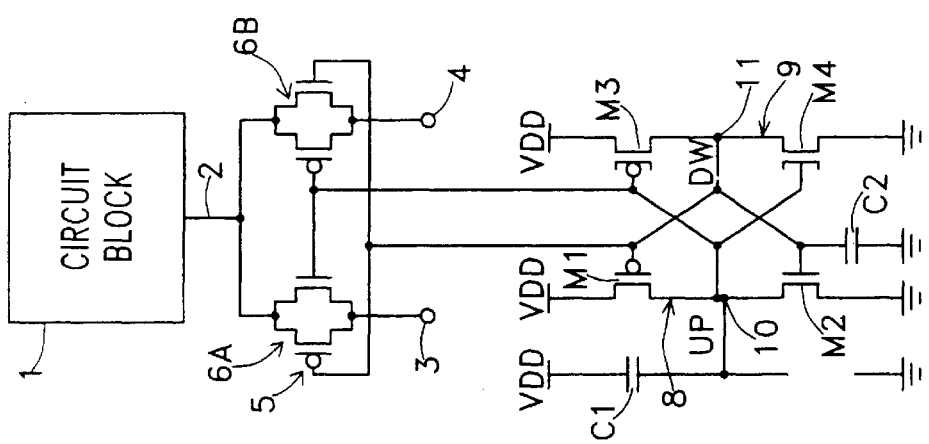
Figure 1A:
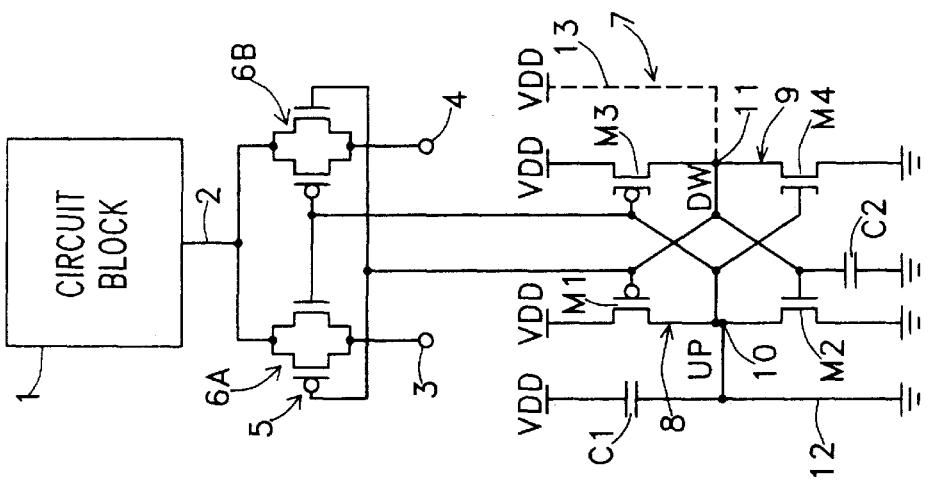

With reference to FIG. 1A, there is shown a circuit comprising a generic circuit block 1 supplied with an input drive signal 2. In order to provide, during design, the possibility of choosing between connecting the input drive signal 2 of block 1 to a first drive signal 3 or to a second drive signal 4, input 2 of block 1 is connected to the output of a multiplexer 5 having as inputs signals 3 and 4. Multiplexer 5 is, for example, made up of a pair of transfer gates 6A and 6B, each one composed conventionally by a P-channel MOSFET and an N-channel MOSFET parallelly connected. Multiplexer 5 is controlled by two signals UP and DW, which are logical complements of each other. Signal UP controls the N-channel MOSFET of transfer gate 6A and the P-channel MOSFET of transfer gate 6B, while signal DW controls the P-channel MOSFET of transfer gate 6A and the N-channel MOSFET of transfer gate 6B.

Signals UP and DW form the outputs of a configuration circuit 7 formed by a latch. The latch comprises a first circuit branch 8 comprising a P-channel MOSFET M1 and an N-channel MOSFET M2 connected in series between a supply voltage VDD and ground, and a second circuit branch 9 also comprising a P-channel MOSFET M3 and an N-channel MOSFET M4 connected in series between voltage VDD and ground. Signal UP is taken from common node 10 between M1 and M2, which is also connected to the gate of M3 and M4. Similarly, signal DW is taken from common node 11 between M3 and M4, which is also connected to the gate of M1 and M2. MOSFET M3 is fabricated to have a threshold voltage higher in absolute value (i.e., less negative) than MOSFET M1 in branch 8. Similarly, MOSFET M4 is fabricated to have a threshold voltage lower than MOSFET M2. In this way, latch 7 is unbalanced, that is, it has a clear tendency to switch into the state with signal DW low and signal UP high. It is possible, even though not strictly necessary, to provide two capacitors C1 and C2, respectively connected between node 10 and voltage VDD, and between node 11 and ground. These capacitors enhance the tendency of the latch to switch into the above-referred state of DW low and UP being high.

FIG. 1A also shows an electrical link 12 of node 10 to ground. This link, which forces the latch 7 to take a state opposite than the one into which the latch 7 naturally will switch (i.e., into a state wherein node 10 is at the low logic level and node DW is at the high logic level), is provided during design as a normally-on option. In this condition, since signal UP is forced into the low logic level and signal DW forced into the high logic level, input 2 of block 1 is connected to drive signal 4, while the transfer gate 6A, being disabled, isolates the input 2 from the drive signal 3. In other words, even if during design two alternatives are provided, only one of said alternatives has been made active. In the example given above, the only alternative made active is the one wherein block 1 is driven by signal 4.

Now suppose that during testing of the device, after having completely determined the integrated circuit performance with the above-referred option, the other option is to be tested, that is, providing for driving block 1 with signal 3. To this purpose, it is sufficient to physically cut the interconnection line 12. This procedure is normally followed during testing of the integrated circuits. Once line 12 has been cut as shown in FIG. 1B, node 10 is no longer forced to ground, and latch 7 switches into the natural state where node UP is at the high logic level and node DW is at the low logic level. As a result, transfer gate 6B is disabled, and transfer gate 6A is enabled. The input 2 of block 1 is thus driven by drive signal 3. It is thus now possible to characterize the performance of the integrated circuit with this second option.

It should be noted that in neither of the preceding examples does the latch introduce current consumption because it is a CMOS circuit and the two conditions are stable operating conditions. Even after having cut interconnection line 12, no signals with undefined logic levels exist.

FIG. 1C shows a situation where, after having experimentally tested the alternative of FIG. 1B in which input 2 of block 1 is driven by signal 3 and having decided that this alternative is to be preferred to the one initially enabled in the design phase, the photolithographic masks have been modified to eliminate the electric interconnection of node 10 to ground. At the same time, since one or more photolithographic masks are to be modified, it is preferable to introduce an electric link 14 between node 11 and ground, so as to assure that latch 7 is brought into the state wherein node 11 is at the low logic level and node 10 is at the high logic level.

FIG. 1A also shows in dashed line an electric link 13 between node 11 and voltage VDD. This is a alternative embodiment of forcing the circuit to a particular state. This electric link can be provided during design or during testing phase in alternative to the link 12. In this case, latch 7 would also be forced in the unnatural condition with node 11 at the high level and node 10 at the low level. Cutting link 13, will allow latch 7 to switch into the natural state with node 11 at the low level and node 10 at the high level.

Figure 2:
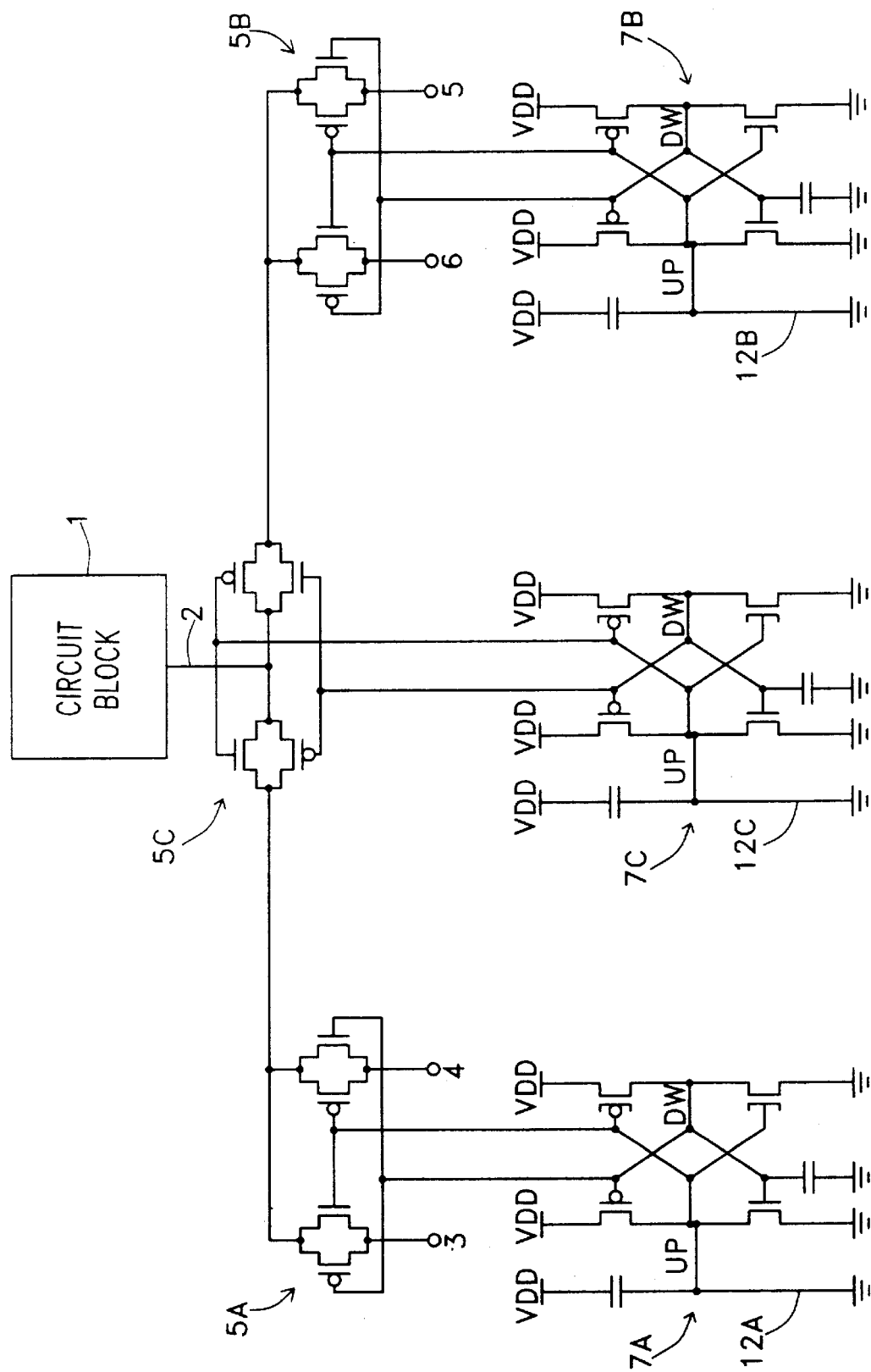
FIG. 2 shows a circuit according to another embodiment of the present invention.

FIG. 2 shows a second embodiment of the present invention. Differently from the previous embodiment, it is now assumed that the circuit alternatives to be tested are four instead of two, that is, the drive input 2 of block 1 could be driven by drive signal 3 or 4, as well as by signals 5 or 6. In this case, it is necessary to provide three multiplexers 5A, 5B and 5C identical to multiplexer 5 in FIG. 1A. The three multiplexers 5A, 5B and 5C are controlled, similarly to that shown in FIG. 1A, by three respective latches 7A, 7B and 7C identical to latch 7 in FIG. 1A and unbalanced as previously described. Latches 7A, 7B and 7C are forced in the condition opposite to the natural one by means of respective electric interconnection lines 12A, 12B and 12C. Cutting the electrical links 12A, 12B and 12C makes it possible to test in sequence each of the four possible options by connecting input 2 of circuit block 1 to either signals 3, 4, 5 or 6.

What is claimed is:

1. A circuit for selectively enabling one among a plurality of circuit alternatives of an integrated circuit, comprising:

a selection circuit configured to select one among said circuit alternatives; and at least one latch circuit configured to control the selection circuit and to have the tendency to switch to a preferred state, the at least one latch circuit comprising two circuit branches, a first circuit branch comprising a first transistor and a second transistor serially connected between a supply voltage and ground, a second circuit branch comprising a third transistor and a fourth transistor serially connected between the supply voltage and ground, a first common node between the first and second transistors being connected to control electrodes of the third and fourth transistors and forming an output of the latch, a second common node between the third and fourth transistors being connected to control electrodes of the first and second transistors, said third and fourth transistors having turn-on voltages respectively lower, in absolute value, than the turn-on voltages of the first and second transistors, a metal electrical interconnection line connecting the first common node to ground, a first capacitor connected between the first common node and the supply voltage and a second capacitor connected between the second node and ground.

2. The circuit according to claim 1 wherein said selection circuit comprises at least one multiplexer with two inputs and one output, driven by said at least one latch so as to transfer to said output of the at least one multiplexer one or the other of two input drive signals.

3. The circuit according to claim 2 wherein said selection circuit comprises a plurality of multiplexers having two inputs and one output, each multiplexer being driven by a respective latch.

4. A selection circuit for selecting a circuit from among a plurality of alternative circuits integrated on a monolithic substrate, the selection circuit comprising:

a multiplexer with a signal output, a first signal input and a second signal input, the first and the second inputs of the multiplexer each coupled to provide a respective drive signal to the signal output;

a bistable latch circuit coupled to the multiplexer, the bistable latch circuit being structured to have a first logic state and a second logic state, wherein the logic state of the bistable latch circuit determines the output of the multiplexer, the bistable latch circuit comprising:

a first circuit branch having a first transistor and a second transistor serially connected between a power supply line and a ground line;

a second circuit branch having a third transistor and a fourth transistor serially connected between a power supply line and a ground line;

a first common node between the first and second transistors, the first common node being coupled to control terminals of the third and fourth transistors, and the multiplexer;

a second common node between the third and fourth transistors, the second common node being coupled to control terminals of the first and second transistors, and the multiplexer;

a first capacitor coupled between the first common node and the power supply line;

a second capacitor coupled between the second common node and the ground line; and an override terminal coupled to a signal line for forcing the bistable latch circuit into either the first logic state or the second logic state, the override terminal thereby leaving the bistable latch circuit and the multiplexer in a well-defined logic level.

5. The selection circuit according to claim 4 wherein the first logic state of the bistable latch circuit is a preferred logic state, and the bistable latch circuit is structured to switch into the preferred logic state when the override terminal is decoupled from the signal line.

6. The selection circuit according to claim 4 wherein the signal line is a power supply line.

7. The selection circuit according to claim 4 wherein the signal line is a ground line.

8. The selection circuit according to claim 4 wherein the first, second, third, and fourth transistors are field-effect transistors.

9. The selection circuit according to claim 4 wherein the third transistor and the fourth transistor have threshold voltages lower, in absolute value, than the first transistor and the second transistor, respectively.

10. A circuit for selectively enabling one among a plurality of circuit alternatives of an integrated circuit, comprising:

selection circuit means for selecting one among the circuit alternatives;

at least one latch that controls the selection means, each latch having a tendency to switch to a preferred state, the at least one latch comprises two circuit branches, a first circuit branch comprising a first transistor and a second transistor serially connected between a supply voltage and ground, a second circuit branch comprising a third transistor and a fourth transistor serially connected between the supply voltage and ground, a first common node between the first and second transistors being connected to control electrodes of the third and fourth transistors and forming an output of the at least one latch, a first capacitor connected between the first common node and the supply voltage, a second common node between the third and fourth transistors being connected to control electrodes of the first and second transistors, and a second capacitor connected between the second common node and ground, the third and fourth transistors having turn-on voltages respectively lower, in absolute value, than the turn-on voltages of the first and second transistors; and at least one metal electrical interconnection line connecting the first common node of a respective one of the at least one latch to ground to force the at least one latch into a state opposite than the preferred state, the at least one latch automatically switching to the preferred state when the at least one metal electrical interconnection line is interrupted.

11. A selection circuit for selecting a circuit from among a plurality of alternative circuits integrated on a monolithic substrate, the selection circuit comprising:

a multiplexer with a signal output, a first signal input and a second signal input, the first and the second inputs of the multiplexer each coupled to provide a respective drive signal to the signal output;

a bistable latch circuit coupled to the multiplexer, the bistable latch circuit being structured to have a first logic state and a second logic state, wherein the logic state of the bistable latch circuit determines the output of the multiplexer, the bistable latch circuit including:

a first circuit branch having a first transistor and a second transistor serially connected between a power supply line and a ground line;

a second circuit branch having a third transistor and a fourth transistor serially connected between a power supply line and a ground line;

a first common node between the first and second transistors, the first common node being coupled to control terminals of the third and fourth transistors, and the multiplexer;

a first capacitor coupled between the first common node and the power supply line;

a second common node between the third and fourth transistors, the second common node being coupled to control terminals of the first and second transistors, and the multiplexer; and a second capacitor coupled between the second common node and the ground line; and an override terminal coupled to a signal line for forcing the bistable latch circuit into either the first logic state or the second logic state.

* * * * *